United States Patent [19]

Ohmi et al.

[11] Patent Number: 5,300,316

[45] Date of Patent: Apr. 5, 1994

[54] METHOD OF FORMING THIN OXYSULFIDE FILM

[75] Inventors: Koutoku Ohmi; Takashi Nire, both of Hiratsuka, Japan

[73] Assignee: Kabushiki Kaisha Komatsu Seisakusho, Hiratsuka, Japan

[21] Appl. No.: 988,786

[22] Filed: Dec. 10, 1992

[30] Foreign Application Priority Data

Dec. 11, 1991 [JP] Japan .................................. 3-327813

[51] Int. Cl.$^5$ .......................... B05D 5/12; B05D 3/06
[52] U.S. Cl. ........................................ 427/66; 427/69; 427/255.2; 427/255.3; 427/419.2; 252/301.45; 313/498; 313/509
[58] Field of Search ................... 427/255.2, 255.3, 66, 427/69, 419.2; 252/301.45; 313/498, 509

[56] References Cited

U.S. PATENT DOCUMENTS

| 4,770,950 | 9/1988 | Ohnishi | 252/301.45 |
| 4,981,712 | 1/1991 | Yamamoto et al. | 427/66 |
| 5,006,365 | 4/1991 | Nire et al. | 427/66 |
| 5,084,312 | 1/1992 | Krikorian et al. | 428/35.8 |
| 5,096,735 | 3/1992 | Nakaya et al. | 427/255.2 |
| 5,110,622 | 5/1992 | Hasegawa et al. | 427/561 |
| 5,116,640 | 5/1992 | Mikami et al. | 427/255.2 |
| 5,147,683 | 9/1992 | Tanaka et al. | 427/255.2 |

OTHER PUBLICATIONS

Wolf and Tauber, *Silicon Processing for the VLSI Era*, "Chemical Vapor Deposition of Amorphous & Polycrystalline Thin Films," p. 164, 1986.

*Primary Examiner*—Anthony Green
*Attorney, Agent, or Firm*—Welsh & Katz, Ltd.

[57] ABSTRACT

In order to provide a thin oxysulfide film excellent in crystallinity and suitable for use as a luminescent layer of a thin film EL device and a thin fluorescent film for a CRT, a metal element is evaporated from an evaporation source provided in a chamber in which a sulfur gas and an oxygen gas have been introduced to combine those substances chemically on a substrate provided in the chamber to form a thin oxysulfide film on a surface of the substrate.

7 Claims, 3 Drawing Sheets

METHOD OF FORMING THIN OXYSULFIDE FILM

BACKGROUND OF THE INVENTION

1. Field of the Invention

The present invention relates to a method of forming a thin oxysulfide film and more particularly to a method of forming a thin oxysulfide film having a good crystallinity suitable for use as a fluorescent film in thin film EL (electroluminescence) devices and CRTs.

2. Description of the Related Art

Because of many problems in respect of luminance, a dispersive type EL device which uses zinc sulfide (ZnS) fluorescent powder has been deterred its development as a light source for illumination. In its place, a thin film EL device using a thin film phosphor layer has drawn attention recently because it can generate high luminance.

In the thin film EL device, since the luminescent layer is made of a thin transparent film, halation and oozing due to scattering of light incident into the luminescent layer and light generated within the luminescent layer do not occur to any great degree, the thin film EL device exhibits clear and high-contrast display performances. Therefore, the thin film EL device is suitable for display units of vehicle-mounted type and for computer terminals, etc. as well as a light source for illumination.

The thin film EL device is generally of a layered structure comprising a transparent substrate, a transparent electrode made of a tin oxide ($SnO_2$) layer, a first dielectric layer, a luminescent layer made of a host material layer with luminescent center impurities being added thereto, a second dielectric layer, and a rear electrode made of an aluminum layer, sequentially laminated in this order.

The luminescence process of the thin film EL device is as follows. When a required voltage is applied across the transparent and rear electrodes, an electric field is created within the luminescent layer by which electrons trapped in the interface state are drawn out and accelerated to have sufficient energy and collide with orbital electrons of the luminescent center substance, for example, Eu, to excite the orbital electrons. When the excited luminescent center substance returns to its ground state, it emits light.

In a conventional thin film EL device, a luminescent layer comprising, for example, a host material of $Y_2O_2S$ containing Eu as a luminescent center impurity (hereinafter expressed as $Y_2O_2S$:Eu) is formed by the process of sputtering or electron beam deposition.

In the sputtering process, for example, a sintered pellet made of a mixture of $Y_2O_2S$:Eu fluorescent powder and sulfur is sputtered, thereby to deposit the sputtered mixture on a substrate.

According to the conventional method of forming the luminescent layer, when the substrate temperature and the sulfur density are low, $Y_2O_3$:Eu is produced while when the substrate temperature is increased to about 200°–400° C., $Y_2O_2S$:Eu is produced. The resulting $Y_2O_2S$:Eu, however, exhibits a low orientation characteristic and has a granular multi-crystalline structure or a structure containing a so-called dead layer in which many small crystalline grains is produced at the early stage of growth. When the substrate temperature is further increased, orientation characteristics are improved, but sulfur is eliminated, thereby producing $Y_2O_3$:Eu, the undesirable.

When a luminescent layer contains a dead layer, electrons in the luminescent layer accelerated by an externally applied electric field are scattered by a crystalline granular interface before they collide with luminescent center impurities so as to emit light. Thus, the externally applied electric field does not contribute effectively to the light emission.

For a CRT display, $Y_2O_2S$:Eu is used which is produced by sintering for several hours at a temperature of about 1000° C. However, crystallinity is low unless it is sintered at high temperature and the resulting grain size is large, for example, larger than several $\mu$m. Therefore, it is disadvantageous when used as a thin film luminescent material.

This problem applies not only to $Y_2O_2S$:Eu, but also to other thin oxysulfide films.

As described above, in the conventional method, a film having high crystallinity cannot be obtained at low temperature while if the substrate temperature is increased, sulfur is eliminated, so that a thin excellent oxysulfide film cannot be obtained in this manner either.

SUMMARY OF THE INVENTION

It is therefore an object of the present invention to provide a thin oxysulfide film excellent in crystallinity and suitable for a luminescent layer of thin film EL devices or a fluorescent film for CRTs.

According to the present invention, a thin oxysulfide film is formed by evaporating a metal element within a chamber in which an oxygen gas and a sulfur gas are introduced to combine them chemically on a substrate to form a thin metal oxysulfide film on a surface of the substrate.

Preferably, at least one of impurities of Ce, Pr, Nd, Pm, Sm, Eu, Gd, Tb, Dy, Ho, Er, Tm and Yb is evaporated from an independent evaporation source to be added to the film when the film is formed.

According to the method of the present invention, evaporation of a metal element and supplying of sulfur and oxygen are independently controlled such that these substances are chemically combined on a substrate to form a luminescent layer whose composition is stoichiometric. Thus, a thin oxysulfide film having high crystallinity is produced.

Even if the temperature of the substrate is raised for the purpose of improving the crystallinity, since sulfur is supplied into the chamber in the form of gas, the sulfur will not be eliminated and the quantity of sulfur is appropriately controlled. Therefore, a thin rare earth oxysulfide film having a good stoichiometric composition can be produced.

It is preferable to add at least one of Ce, Pr, Nd, Pm, Sm, Eu, Gd, Tb, Dy, Ho, Er, Tm, Yb as the luminescent center impurity at the time of the film formation. Then, a thin luminescent layer having uniform distribution of luminescent center impurity and excellent crystallinity can be produced.

This is because the process of growth takes place as follows.

Assume that substance A is evaporated from an evaporation source, and substances B and C are supplied in a vapor phase to form a substance ABC on the substrate. Let the substances A, B and C be a metal, oxygen and sulfur, respectively. If the metal A is an element in Group IIa of the periodic table such as Ca or Sr or an element in Group IIb such as Zn or Cd, and the temperature Ts of the substrate is relatively low (for example, lower than 600° C.), it is possible to establish the following conditions: $P_O<<P_A$, $P_O<<P_B$ and $P_O<<P_C$ where $P_O$ is degree of vacuum (pressure) of the chamber and $P_A$, $P_B$ and $P_C$ are the vapor pressures of the substances A, B and C, respectively. Under such conditions, the substances A, B and C by themselves do not substantially stick to the substrate, so that the compound ABC alone grows selectively.

In the case where the metal A is an element in Group IIIa such as La or Y, $P_A$ does not become very large so that the metal A alone sticks to the substrate. However, it is considered that the compound ABC may also grow selectively probably for the following reason. Taking $Y_2O_2S$ for example, the process: $2Y+O_2+1/2S_2$ $Y_2O_2S$ is an exothermic reaction and the elements A, B and C are very active on the surface of the thin film. Therefore, these elements, particularly the element A, can have kinetic energy sufficient for settling themselves in the most stable position. As a result, a thin film excellent in flatness and crystallinity will be formed even at a low substrate temperature.

This applies to a case where luminescent center impurities are added. As a result, although a thin fluorescent film, for example, of $Y_2O_2S$:Eu, does not generally exhibit sufficient luminous efficiency unless heat treatment is carried out at a temperature above 1000° C., the film forming method according to the present invention provides a thin fluorescent film having a satisfactory high luminous efficiency even at a temperature lower than 600° C.

DETAILED DESCRIPTION OF THE EMBODIMENTS

Embodiments of the present invention will be described below in detail with reference to the drawings.

Figure 1:
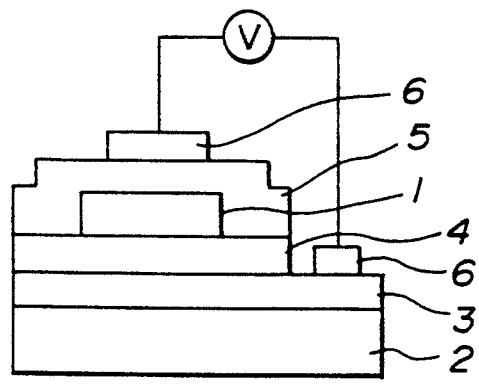
FIG. 1 schematically illustrates a thin film EL device of an embodiment of the present invention.

Referring to FIG. 1, a thin film EL device of a first embodiment has a double dielectric layer structure in which a luminescent layer 1 is made of a host material of $Y_2O_2S$ containing Eu as a luminescent center impurity ($Y_2O_2S$: Eu) and has a thickness of 500 nm.

More particularly, the EL device comprises a transparent glass substrate 2 having a thickness of 1 mm, a transparent electrode 3 made of tin oxide ($SnO_2$) having a thickness of 0.3 μm formed on substrate 2, a first dielectric layer 4 made of tantalum oxide ($Ta_2O_5$) having a thickness of 0.5 μm, the luminescent layer 1 as described above, a second dielectric layer 5 made of tantalum oxide ($Ta_2O_5$) having a thickness of 0.5 μm, and rear electrodes 6 made of aluminum having a thickness of 0.5 μm, disposed in this order.

A method of producing such a thin film EL device will be described by referring to FIGS. 2(a)–(e).

Figure 2A:
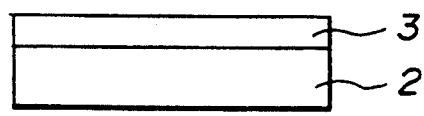
FIG. 2(a)–(e) illustrates a process for manufacturing the thin film EL device of FIG. 1.
Figure 2B:
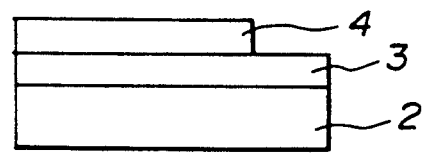
Figure 2C:
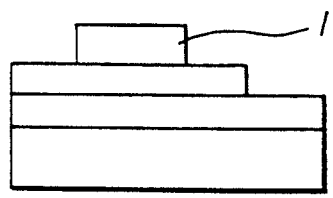

First, the transparent electrode 3 made of $SnO_2$ is formed on a transparent glass substrate 2 by sputtering process (FIG. 2(a)), and the first dielectric layer 4 made of tantalum oxide is formed by sputtering process (FIG. 2(b)).

Subsequently, the luminescent layer 1 is formed using a thin film growth device shown in FIG. 3. The device comprises a vacuum chamber 10 in which a crucible 11 for containing yttrium (Y), a crucible 12 for containing luminescent center impurity of Eu, a sulfur gas introducing tube 13 for supplying sulfur gas, an oxygen gas introducing tube 14 for supplying oxygen gas, a substrate support 16 for supporting a substrate and a heater 15 for heating the temperature of the substrate. Temperatures of crucible 11 and 12, quantities of sulfur gas supplied from the sulfur gas introducing tube 13 and oxygen gas supplied from the oxygen gas introducing tube 14 are controlled independently. The sulfur gas is supplied by heating sulfur 18 by means of a heater 17. The supply of the sulfur gas and the oxygen gas is controlled by valves 19a and 19b and a mass-flow controller 20.

In the formation of the film, the vapor pressure within the vacuum chamber 10 is first set at $10^{-5}$ Torr. Then, setting the temperature $T_s$ of glass substrate 2 at 565° C., sulfur gas and oxygen gas are supplied while controlling the temperatures of crucible 11 and 12 and, the quantities of supplied sulfur gas and oxygen gas independently such that the composition of the luminescent layer is stoichiometric.

The luminescent layer 1 having grown in the above manner is made of a thin $Y_2O_2S$: Eu film having a thickness of 300 nm where the luminescent center impurities of Eu are uniformly distributed and having excellent crystallinity (FIG. 2(c)). The partial pressures of oxygen and sulfur gases are $3.0 \times 10^{-4}$ Torr and $1.5 \times 10^{-4}$ Torr, respectively.

Figure 4:
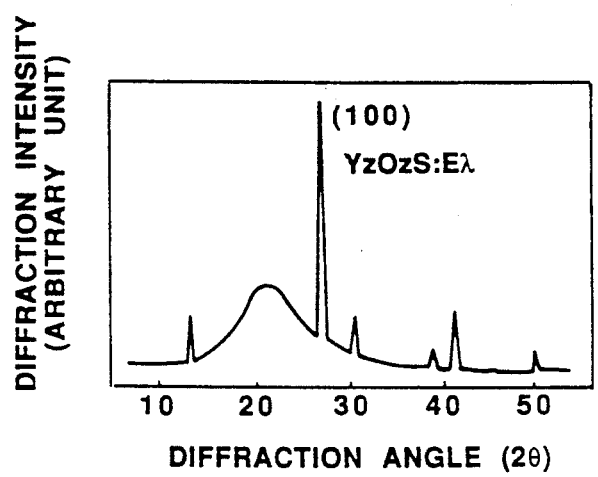
FIG. 4 is a graph illustrating a result of X-ray diffraction of a luminescent layer of a thin film EL device formed by the inventive method.

FIG. 4 shows the result of X-ray diffraction of $Y_2O_2S$: Eu thus obtained. The result shows that $Y_2O_2S$: Eu has excellent crystallinity and orientation (100).

Figure 2D:
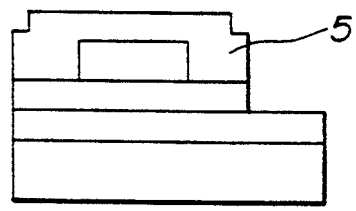

Then, as shown in FIG. 2(d), the second dielectric layer 5 made of a tantalum oxide layer is formed by sputtering process.

Figure 2E:
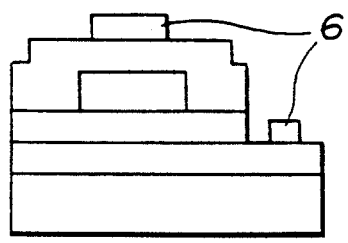

Finally, as shown in FIG. 2(e), an aluminum film is formed by vacuum deposition and then patterned to form the rear electrode 6 by photolithography process.

The thin film EL device is operable by applying an alternating electric field across the transparent and the rear electrodes. The device has a high luminance performance at a low voltage.

While the luminescent layer is made of a thin $Y_2O_2S$: Eu film in the above embodiment, the present invention is not limited to this. Same effects can be achieved by using other metal oxysulfide as host material and at least one of Ce, Pr, Nd, Pm, Sm, Gd, Tb, Dy, Ho, Er, Tm and Yb as a luminescent center impurity which is added to the host material when the film is formed.

Thin metal oxysulfide film is usable not only in thin film EL devices, but also in fluorescent films for CRTs and X-ray intensifying screens.

In addition, the present invention is applicable to the formation of thin $ZnO_xS_{1-x}$ films in addition to the formation of thin films of oxysulfides of rare earth elements.

Figure 5:
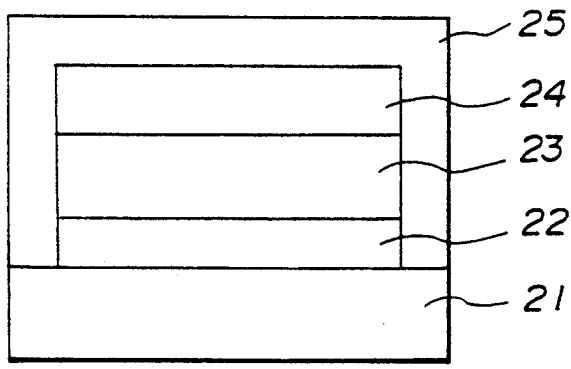
FIG. 5 shows an X-ray fluorescent plate in a second embodiment of the present invention.

A method of making an X-ray fluorescent plate as a second embodiment of the present invention will be described referring to FIG. 5. The X-ray fluorescent plate is characterized by a sensitized fluorescent layer 13 formed by the thin film forming process of the present invention. As shown in FIG. 5, the X-ray fluorescent plate comprises a reflective tungsten layer 22 having a thickness of 0.5 μm formed on a transparent glass substrate 21, a sensitized fluorescent layer 23 made of $Gd_2O_2S$: Tb and having a thickness of 3 μm formed on reflective layer 22, an X-ray film stuck to the layer 23 and a photo-preventive cover which covers the whole of the product thus formed.

The process of making the X-ray fluorescent plate is as follows.

A thin tungsten film 22 is formed on the glass substrate 21 having a thickness of 1 mm by electron beam vapor deposition.

Figure 3:
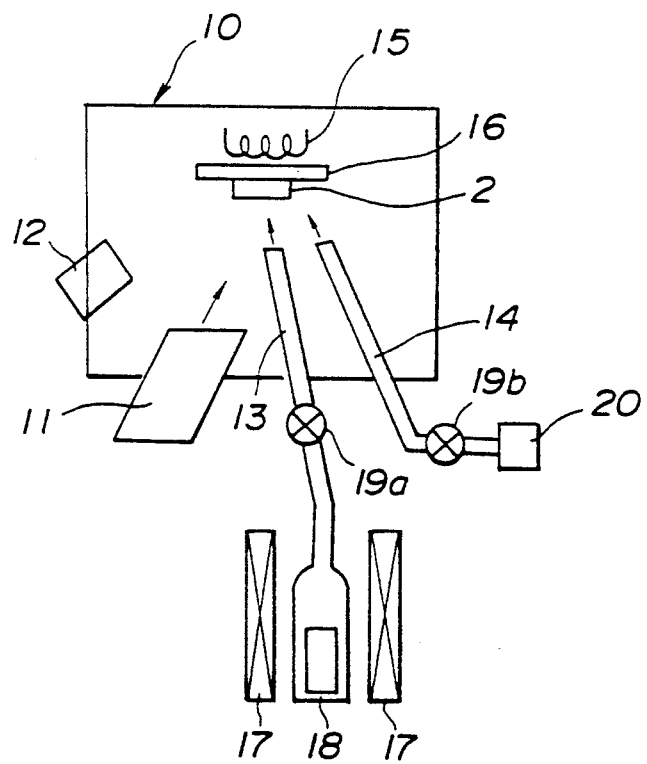
FIG. 3 schematically illustrates a device for forming a thin film in carrying out a method according to the present invention.

Then, the sensitized fluorescent layer 23 is formed using a thin film growing device shown in FIG. 3 in which the crucible 11 contains gadolinium (Gd) and the crucible 12 contains luminescent center impurity Tb.

In the formation of the film, the vapor pressure within the vacuum chamber 10 is first set at $10^{-5}$ Torr. Then, setting the temperature $T_s$ of the glass substrate 21 at 580° C., sulfur gas and oxygen gas are suplied while controlling the temperatures of crucible 11 and 12, the quantities of supplied sulfur gas and oxygen gas independently such that the composition of the sensitized fluorescent layer is stoichiometric.

The thin sensitized fluorescent layer 23 having grown in the above manner is made of a thin $Gd_2O_2S$: Tb film having a thickness of 3 μm where the luminescent center impurities of Tb are uniformly distributed and having excellent crystallinity. The partial pressures of oxygen and sulfur gases are $3.0\times10^{-4}$ Torr and $1.5\times10^{-4}$ Torr, respectively.

An X-ray film 24 is stuck to the sensitized fluorescent layer 23 thus obtained, and a cover 25 which prevents the film from being exposed is mounted on the whole of the product thus obtained.

The conventional X-ray fluorescent plate has a structure in which a sensitized sheet is stuck to each side of an X-ray film. According to the present invention, the sensitized fluorescent layer 23 is made of $Gd_2O_2S$: Tb with Tb being added uniformly. Since the sensitized fluorescent layer has an excellent performance, it is required to be formed on only one side of the X-ray film. Therefore, the X-ray fluorescent plate can be made with a simple structure and can detect X-rays with very high sensitivity. Therefore, productivity of the plate is improved and the production cost is reduced.

What is claimed is:

1. A method of forming a thin metal oxysulfide film on a substrate comprising the steps of:
    introducing oxygen gas and sulfur gas into a chamber; and
    evaporating a metal element from a crucible as an evaporation source provided within the chamber to combine the metal with oxygen and sulfur chemically on a substrate disposed in the chamber so as to form a thin metal oxysulfide film on a surface of the substrate.

2. A method according to claim 1, further comprising the step of evaporating at least one impurity selected from Ce, Pr, Nd, Pm, Sm, Eu, Gd, Tb, Dy, Ho, Er, Tm and Yb from another independent evaporation source so that the at least one impurity is added when the film is formed.

3. A method according to claim 2, wherein temperatures of the evaporation sources are controlled independently from each other.

4. A method of forming a thin metal oxysulfide film according to claim 1, wherein the metal element is an element selected from Group IIa or IIb in the periodic table.

5. A method of forming a thin metal oxysulfide film according to claim 1, wherein the metal element is an element selected from Group IIIa in the periodic table.

6. A method of fabricating a thin film EL device, comprising the steps of:
    forming a transparent electrode on a transparent substrate;
    forming a dielectric layer on the transparent electrode;
    forming an oxysulfide film as a luminescent layer, the luminescent layer forming step comprising the steps of placing a first crucible containing a metal element, a second crucible containing a luminescent center impurity and a gas introducing means for introducing oxygen gas and sulfur gas in a vacuum chamber, placing the transparent substrate on a substrate support which is provided in the vacuum chamber and wherein temperature of said substrate is controllable, and independently controlling respective temperatures of the first and second crucibles, and the quantities of the oxygen gas and the sulfur gas introduced through the gas introducing means to form a luminescent layer having a stoichiometric composition on the dielectric layer; and
    forming a rear electrode.

7. A method of fabricating a thin film EL device according to claim 6, wherein the metal element contained in the first crucible is ytttrium (Y), the luminescent center impurity contained in the second crucible is europium (Eu) and the gas introducing means comprises a first tube which introduces sulfur gas and a second tube which introduces oxygen gas in the vacuum chamber.

* * * * *